United States Patent
Suzuki et al.

[11] Patent Number: 6,131,647
[45] Date of Patent: Oct. 17, 2000

[54] COOLING SYSTEM FOR COOLING HOT OBJECT IN CONTAINER

[75] Inventors: Yukinori Suzuki, Hekinan; Tetsuya Takeuchi, Obu; Kouji Kishita, Motosu-gun, all of Japan

[73] Assignee: DENSO Corporation, Kariya, Japan

[21] Appl. No.: 09/140,198

[22] Filed: Aug. 26, 1998

[30] Foreign Application Priority Data

| Sep. 4, 1997 | [JP] | Japan | 9-239914 |
| Oct. 30, 1997 | [JP] | Japan | 9-298999 |

[51] Int. Cl.$^7$ ............... F28D 15/00; A23C 3/02
[52] U.S. Cl. .............. 165/104.33; 165/66; 165/104.14
[58] Field of Search ............ 165/104.33, 104.14, 165/104.15, 66

[56] References Cited

U.S. PATENT DOCUMENTS

| 4,293,030 | 10/1981 | Rambach | 165/104.33 |
| 4,306,613 | 12/1981 | Christopher | 165/104.14 |
| 4,600,050 | 7/1986 | Noren | 165/104.33 |
| 4,907,644 | 3/1990 | Ghiraldi | 165/104.33 |
| 5,671,805 | 9/1997 | Stahl et al. | 165/104.33 |
| 5,806,583 | 9/1998 | Suzuki et al. | 165/104.14 |
| 5,832,988 | 11/1998 | Mistry et al. | 165/104.33 |

FOREIGN PATENT DOCUMENTS

| 0035829 | 3/1990 | Japan | 165/104.14 |

*Primary Examiner*—Carl D. Price
*Assistant Examiner*—Tho Duong
*Attorney, Agent, or Firm*—Harness, Dickey & Pierce, PLC

[57] ABSTRACT

In a cooling system to cool down a hot object contained in a closed container, a heat exchanger is used in addition to an air-conditioner to share thermal load to dissipate heat generated by the hot object. Since the heat exchanger which requires almost no operating power shares heat load with the air-conditioner which consumes a high operating power, a total power consumption of the cooling system is considerably reduced. An evaporator and a condenser of the heat exchanger are separately installed in the cooling system, and both are connected by pipes through which refrigerant is circulated. The evaporator is placed to an optimum position to effectively absorb heat generated by the hot object. The condenser is installed outside the container to exhaust heat most effectively to outside air. The evaporator and the condenser may be combined before installation, if a whole structure of the cooling system permits. The heat generated by the hot object is led directly to the evaporator to enhance heat exchange efficiency.

5 Claims, 9 Drawing Sheets

$t_1$ : AIR-CONDITIONED TEMP.
$t_2$ : HEATED TEMP.
$t_3$ : TEMP. AFTER EVAPORATOR
$t_4$ : AMBIENT TEMP.
$t_5$ : EXHAUST TEMP.
$W_1 = q(t_2 - t_4)$
$W_2 = 0.9 \times 50(t_1 - t_4)$ ① : COOLING BY HEAT EXCHANGER = $W_1$
② : NATURAL COOLING = $W_2$
③ : COOLING BY AIR-CONDITIONER

COOLING SYSTEM FOR COOLING HOT OBJECT IN CONTAINER

CROSS-REFERENCE TO RELATED APPLICATIONS

This application is based upon and claims benefit of priority of Japanese Patent Applications No. Hei-9-239914 filed on Sep. 4, 1997, and No. Hei-9-298999 filed on Oct. 30, 1997, the contents of which are incorporated herein by reference.

BACKGROUND OF THE INVENTION

1. Field of the Invention

The present invention relates to a cooling system for cooling a hot object such as a communication apparatus contained in a closed container.

2. Description of Related Art

An electronic apparatus used in a base terminal in a telecommunication system is usually contained in a closed container. Such apparatus generates considerable heat in the closed container, and such heat has to be dissipated to protect the apparatus. For this purpose, two devices are generally used: one is a conventional air-conditioner installed in the container, and the other is a heat exchanger which exchanges inside heat with outside air.

An example of such heat exchanger is shown in FIG. 11. A heat pipe 100 is contained in a casing 130. The casing 130 is divided into a hot chamber 150 and a cool chamber 160 by a separating wall 140. The heat pipe 100 having an evaporator 101 and a condenser 102 is installed through the separating wall 140. The evaporator 101 is located in the hot chamber 150 while the condenser 102 is located in the cool chamber 160. Air heated by a hot object flows into the hot chamber 150 and is cooled down by the evaporator 101. Then, the cooled air flows out from an outlet by operation of a blower 110. Heat exchanging medium evaporated in the evaporator 101 flows into the condenser 102. The medium is cooled down in the condenser 102 by outside air introduced into the cool chamber 160. Outside air flows through the condenser 102 and is exhausted to the outside again by operation of a blower 120. Another example of such heat exchanger is shown in FIG. 12. A heat exchanger 200 is contained in a casing 230 which has two blowers 210, 220. Heat is exchanged between heated air and the outside air, and cooled air is sent through an outlet by operation of the blower 210.

When a conventional air-conditioner is used as a cooling device for cooling the closed container, a running cost for operating the air-conditioner is high, because the air-conditioned is generally operated to maintain temperature constant in a heat-insulated container. In other words, the air-conditioner has to be operated even when outside temperature is low as in winter time.

On the other hand, when such a heat exchanger as exemplified above is used as a cooling device, efficiency of heat exchange is not high, because the heat exchanger is made as a unit, and therefore, the evaporator portion cannot be positioned at an optimum place to exchange heat efficiently. Moreover, temperature in the container varies according to the outside temperature.

SUMMARY OF THE INVENTION

The present invention has been made in view of the above-mentioned problems, and an object of the present invention is to provide an efficient cooling system for cooling a hot object contained in a closed container, and more particularly to provide such a system in which a conventional air-conditioner and a heat exchanger are used together to share heat load therebetween. Another object of the present invention is to provide a heat exchanger which is efficient and suitable for cooling a hot object contained in a container.

A heat exchanger having an evaporator and a condenser, both connected by tubes, and containing refrigerant therein is installed in and on a container in which a hot object such as communication electronic apparatus is contained. Such a heat exchanger may be used in addition to an air-conditioned installed in the container to cool down the hot object. The heat exchanger cools down air heated by the hot object to a certain degree, and the air-conditioner cools down the rest of the heat. The evaporator is installed at a vicinity of a hot air outlet to absorb heat from the air heated by the hot object, and the condenser is installed outside the container to exhaust heat to outside air. Since the heat exchanger absorbs heat from the inside air and exhausts heat to the outside air by evaporating and condensing the refrigerant, it consumes no electric power to drive a compressor. It only consumes a small amount of power to drive blowers to circulate air. Thermal load to dissipate heat generated by the hot object is shared by the air-conditioner and the heat exchanger. Accordingly, the power consumption becomes considerably small by using the cooling system of the present invention.

The evaporator and the condenser of the heat exchanger may be separately installed, and then both are connected by pipes through which the refrigerant is circulated. In this arrangement, the evaporator can be placed at an optimum place to effectively absorb heat generated by the hot object. Also, the condenser can be installed outside the container with a high degree of freedom so that it performs heat exchange with a high efficiency.

It is possible to combine the evaporator and the condenser together with connecting pipes before the heat exchanger is installed in the cooling system, if a structure of a whole system permits. In this arrangement, the hot air heated by the hot object has to be led directly to the evaporator. The refrigerant can be filled in the heat exchanger before the installation to simplify the installation work. The heat exchanger may be constituted by an air-to-air heat exchanger which directly exchanges heat between inside air and outside air.

Other objects and features of the present invention will become more readily apparent from a better understanding of the preferred embodiments described below with reference to the following drawings.

DETAILED DESCRIPTION OF THE PREFERRED EMBODIMENTS

Figure 1:
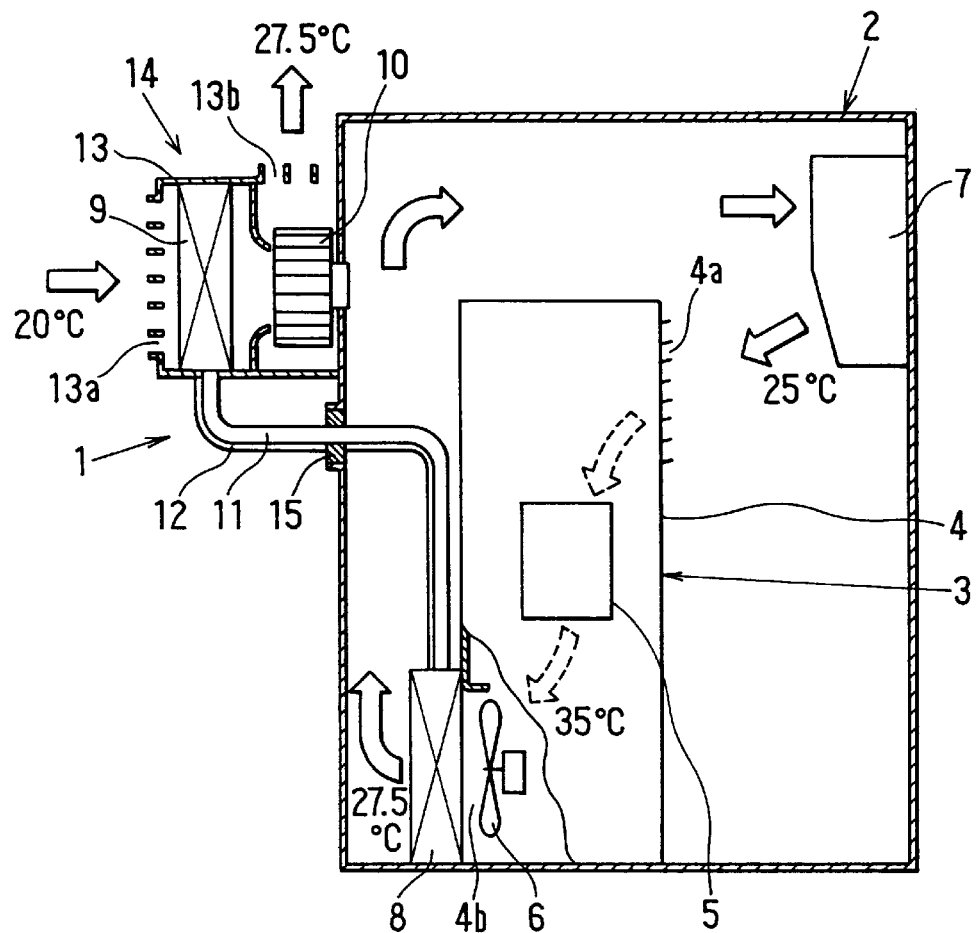
FIG. 1 is a cross-sectional view showing a cooling system as a first embodiment according to the present invention.

Referring to FIG. 1, a first embodiment of the present invention will be described. A communication apparatus 3 which is used as a telecommunication base terminal is contained in a closed container 2. The communication apparatus 3 includes a hot object 5, such as electronic devices and circuits, which is contained in a casing 4 and generates heat when it operates. An air-conditioner 7 (an indoor unit) is installed in the container 2. The casing 4 has a cool air inlet 4a from which air cooled by the air-conditioner 7 is introduced into the cashing 4, and a hot air outlet 4b from which hot air heated by the hot object 5 flows out by operation of an inside blower 6. In addition to the air-conditioner 7, a heat exchanger 1 which includes evaporator 8 and condenser 9 is installed in and on the container 2. In other words, the cooling system is composed of the air-conditioner 7 and the heat exchanger 1.

The heat exchanger 1 is composed of the evaporator 8, the condenser 9, pipes 11, 12 connecting the evaporator 8 to the condenser 9, and an outside blower 10. The evaporator 8 is installed in the container 2, facing the hot air outlet 4b. The condenser 9 is installed outside the container 2 and positioned at a level higher than the evaporator 8. The pipe 11 is a vapor pipe to lead vaporized refrigerant in the evaporator 8 to the condenser 9, and the pipe 12 is a liquid pipe to lead liquid refrigerant from the condenser 9 to the evaporator 8. Both pipes 11, 12 go through a wall of the container 2 and are air-tightly sealed by a seal member 15. The condenser 9 is held in a case 13 which has an outside air inlet 13a and an exhaust outlet 13b. The outside blower 10 is contained in the case 13 and introduces outside air from the outside air inlet 13a and exhausts the air from the exhaust outlet 13b. The case 13, the condenser 9 and the outside blower 10 constitute an outside unit 14 of the heat exchanger 1.

Figure 2:
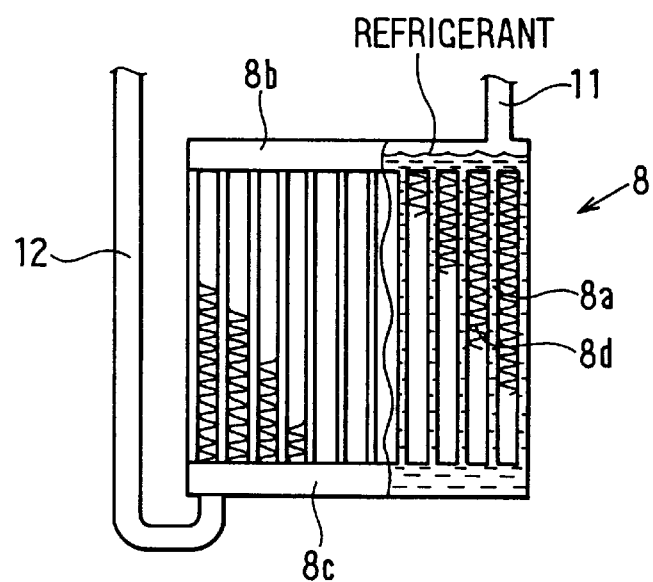
FIG. 2 is a front view (partly cross-sectioned) showing an evaporator used in the cooling system shown in FIG. 1.

FIG. 2 shows a detailed structure of the evaporator 8. The evaporator 8 consists of an upper tank 8b, a lower tank 8c, a plurality of tubes 8a connecting the upper tank 8b and the lower tank 8c, and corrugated fins 8d disposed between tubes 8a. The vapor pipe 11 is connected to the upper tank 8b, and the liquid pipe 12 is connected to the lower tank 8c. Refrigerant is filled in the evaporator 8 up to a level shown in FIG. 2. The condenser 9 has a similar structure as the evaporator 8. The vapor pipe 8b connected to the upper tank 11 of the evaporator 8 is led to an upper tank of the condenser 9, and the liquid pipe 12 connected to the lower tank 8c of the evaporator 8 is led to a lower tank of the condenser 9.

The heat exchanger 1 described above operates in the following manner. Air heated by the hot object 5 in the casing 4 is blown out from the hot air outlet 4b and flows through the evaporator 8. The air is cooled down by the evaporator 8 and returns to the air-conditioner 7. The refrigerant in the evaporator 8 is evaporated by the heated air flowing therethrough. The vaporized refrigerant is led to the condenser 9 through the vapor pipe 11. The refrigerant vapor is cooled down and condensed in the condenser 9 by the outside air flowing through the condenser 9. Latent heat taken from the refrigerant is exhausted to the outside through the exhaust outlet 13b by operation of the outside blower 10. The condensed refrigerant in the condenser 9 is led to the lower tank of the condenser 9 as droplets and returns again to the evaporator 8 through the liquid pipe 12.

Assuming that the outside temperature (ambient temperature) is 20° C. and temperature of air flowing out from the air-conditioner 7 is set at 25° C., the 25° C. air is introduced into the casing 4 through the cool air inlet 4a and heated up to 35° C. by the hot object 5 which generates heat of 3 kw, for example. The 35° C. air is cooled down to 27.5° C. by the evaporator 8, and then the 27.5° C. air returns to the air-conditioner 7. If there is no heat exchanger is installed and all the heat has to be cooled down only by the air-conditioner 7, then the 35° C. air must be cooled down to 25° C. by the air-conditioner 7. Since the cooling system according to the present invention includes the heat exchanger 1 in addition to the air-conditioner 7, the air-conditioner 7 operates only to cool the 27.5° C. air to 25° C. Therefore, operating time of the air-conditioner 7 can be greatly shortened. In other words, a ratio of operating time to non-operating time is reduced, and thereby energy consumed by the air-conditioner can be saved.

Since the evaporator 8 and the condenser 9 of the heat exchanger 1 are not integrated as a unit, as opposed to those of the conventional heat exchanger as mentioned above, the evaporator 8 can be placed at an optimum position where the hot air is directly blown thereto. Accordingly, efficiency of the heat exchanger 1 is greatly enhanced.

Figure 3:
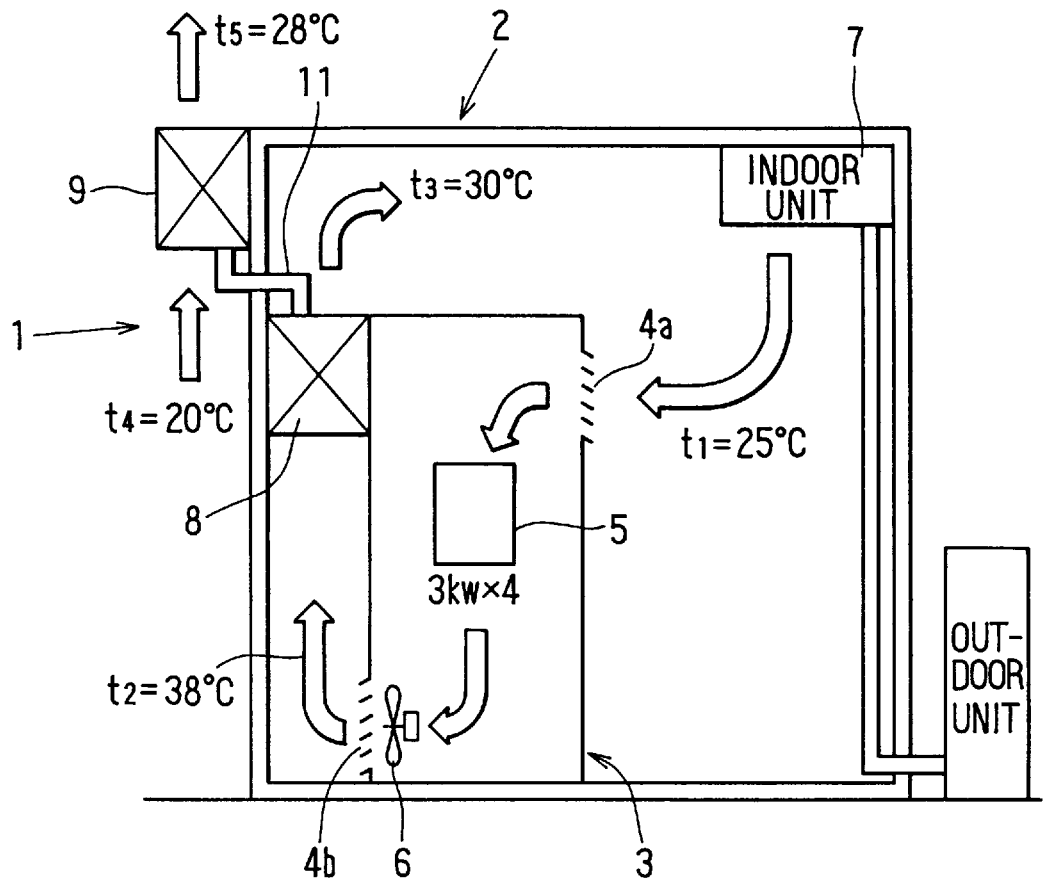
FIG. 3 is a schematic view showing a cooling system for explaining temperature at various positions in the system.
Figure 4:
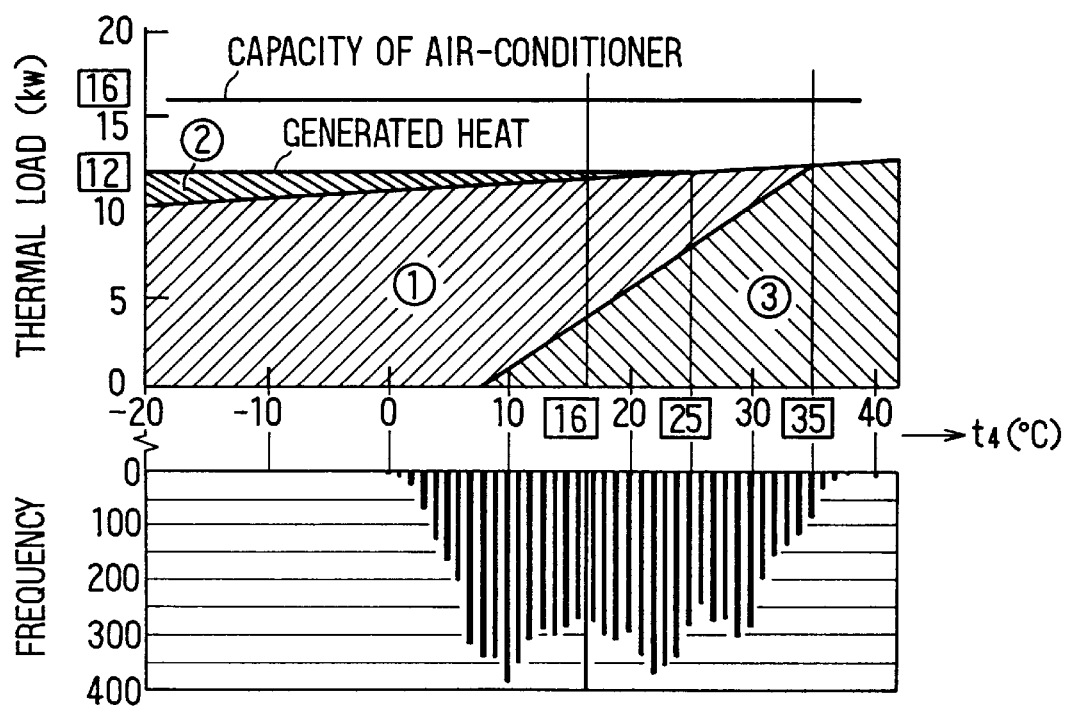
FIG. 4 is a graph showing experimental results as to thermal load shared by an air-conditioner and a heat exchanger in the cooling system shown in FIG. 1.

The cooling system described above has been tested in Hiroshima area in Japan, the results of which are shown in FIGS. 3 and 4. The hot object 5 cooled in the system tested is four wireless communication apparatus, each generates heat of 3 kw. The system is preset so that air temperature (t1) from the air conditioner 7 becomes 25° C. when ambient temperature (t4) is 20° C. Temperature at various positions in the system is shown in FIG. 3. The 25° C. air blown to the hot object 5 which generates 12 kw heat in total is heated to 38° C. (t2) at the hot air outlet 4b. Air temperature (t3) coming out through the evaporator 8 is 30° C. (the 38° C. air is cooled down by the evaporator 8 to 30° C.). The 30° C. air is cooled down to 25° C. by the air conditioner 7. Air is circulated repeatedly in the container 2 in this manner. On the other hand, the outside air of 20° C. (t4) is heated to 28° C. (t5) through the condenser 9. Heat quantity W1 taken away by the heat exchanger 1 is expressed as: W1=q(t2−t4), where q is a cooling ability of the heat exchanger 1. Heat quantity W2 taken away by natural cooling is expressed as: W2=0.9×50(t1−t4).

FIG. 4 shows experimental results of a heat dissipation characteristic of a base terminal which employs the present invention. The base terminal is tested in Hiroshima area. In an upper graph of FIG. 4, ambient temperature (t4) is shown on the abscissa and thermal load (in kw) is shown on the ordinate. The temperature (t1) of the air supplied through the cool air inlet 4a is set at 25° C. When the ambient temperature (t4) is 16° C., for example, 12 kw heat generated in the hot object 5 is cooled down by about 0.5 kw by natural cooling (W2), about 7.5 kw by the heat exchanger 1 (W1) and about 4 kw by the air-conditioner 7. When the ambient temperature (t4) is 35° C., a total heat in the container 2 is about 12.5 kw because a small amount of heat coming into the container has to be added to the generated heat of 12 kw. In this case, heat dissipation by natural cooling and heat exchanger 1 is almost nothing, and all the heat has to be dissipated by the air-conditioner 7. The temperature (t2) in the casing 4 becomes higher than 30° C. even when the ambient temperature (t4) is below −20° C. because of the generated heat of 12 kw. A lower graph in FIG. 4 shows an annual temperature variation at the point where the test is carried out. A frequency of occurrence of a respective ambient temperature is shown in the ordinate. An average ambient temperature is 16° C.

Figure 5:
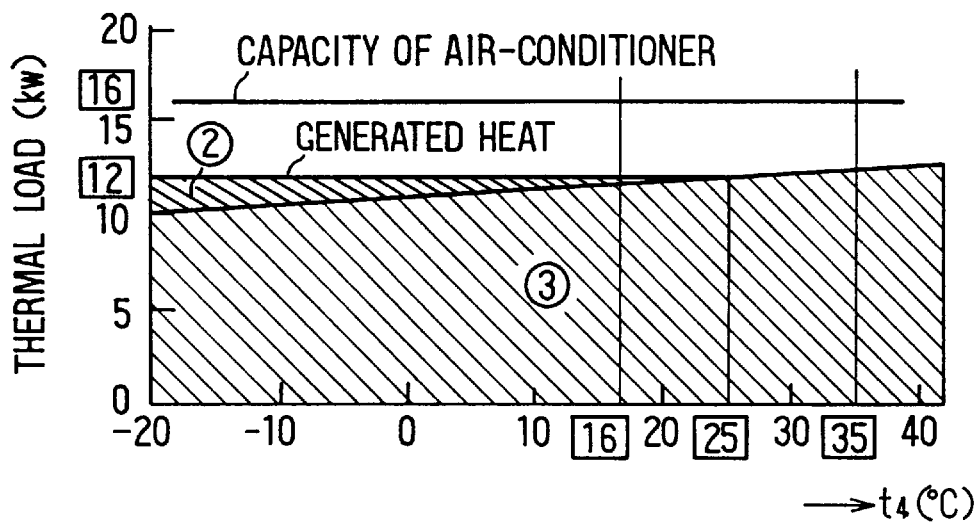
FIG. 5 is a graph showing experimental results as to thermal load in a cooling system in which only an air-conditioner is used.
Figure 6:
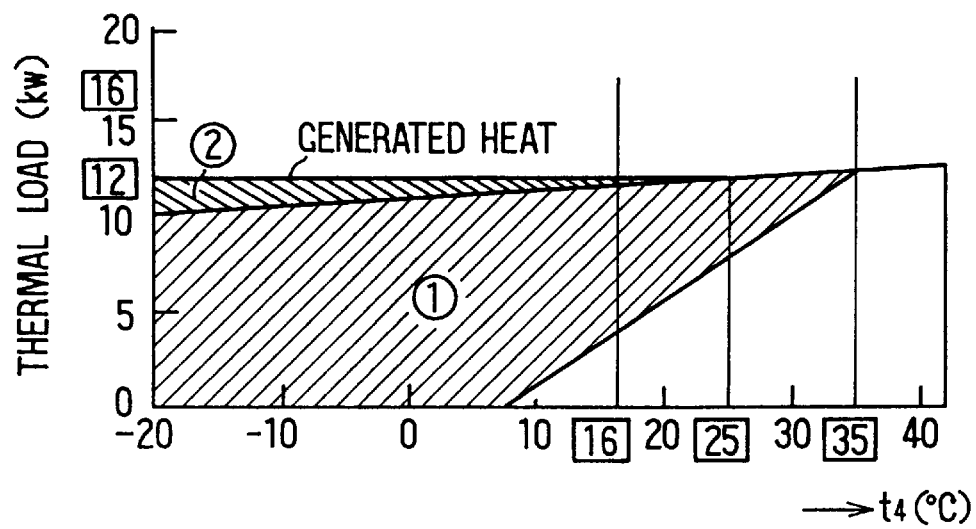
FIG. 6 is a graph showing experimental results as to thermal load in a cooling system in which only a heat exchanger is used.

FIGS. 5 and 6 are graphs similar to FIG. 4 for explaining the advantages of the present invention in comparison with other systems. FIG. 5 shows the thermal load of the system when only the air-conditioner 7 is used, and FIG. 6 when only the heat exchanger 1 is used. As seen in FIG. 5, though the hot object can be cooled down to a temperature desired, for example, to 25° C. only by the air-conditioner 7, the thermal load imposed on the air-conditioner 7 is very high. Accordingly, the running cost of the air-conditioner is high. On the other hand, when no air conditioner is used, as in the system shown in FIG. 6, the running cost is very small, but heat dissipation is not sufficient, especially when the ambient temperature is high. If the ambient temperature is higher than 35° C., substantially no heat is dissipated.

In the cooling system of the present invention, as shown in FIG. 4, the generated heat is mainly dissipated by the air-conditioner 7 when the ambient temperature is high and is mainly dissipated by the heat exchanger 1 when the ambient temperature is low. Especially, when the ambient temperature is lower than 10° C., the air-conditioner is turned off and cooling is performed only by the heat exchanger 1. When the ambient temperature is between 10–35° C., both of the air-conditioner 7 and the hear exchanger 1 are operated to share the thermal load imposed on the system. Accordingly, an operating time ratio (a ratio of operating time to nonoperating time) of the air-conditioner 7 can be considerably low as a whole. According to the test mentioned above (under the average ambient temperature of 16° C.), the operating ratio of the air-conditioner 7 is about 73% when no heat exchanger 1 is used in the system. It is reduced to about 28% by using the heat exchanger 1 in addition to the air-conditioner 7. The running cost of the cooling system is reduced to a half, while attaining the cooling effect as desired.

In addition, the heat exchanger 1 described above can be easily added to a cooling system which is in use with an air-conditioner. The evaporator 8, the condenser 9, and the vapor and liquid pipes 11, 12 can be easily added to the existing system with a minimum installation work.

Figure 7:
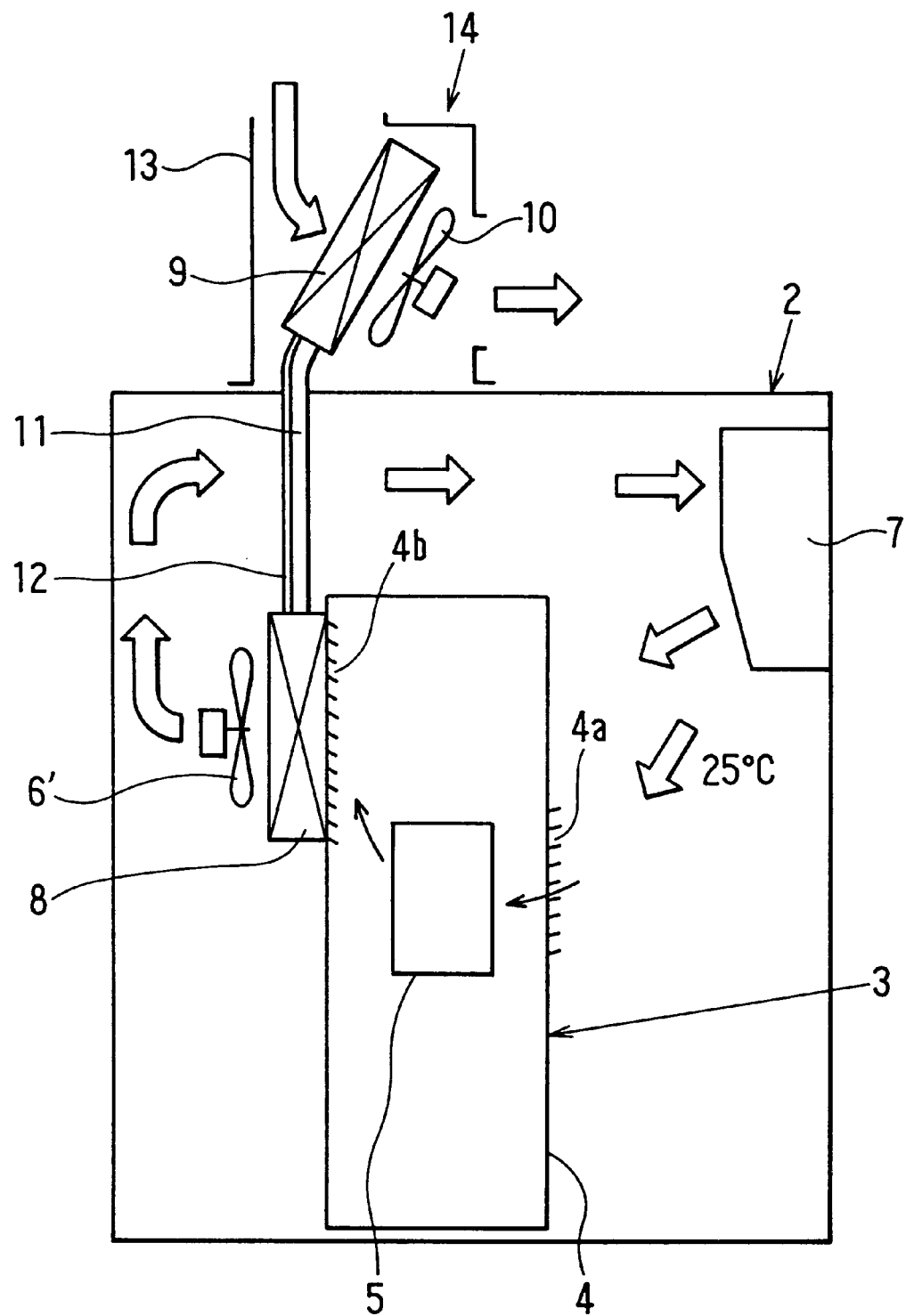
FIG. 7 is a cross-sectional view showing a cooling system as a second embodiment according to the present invention.

FIG. 7 shows a second embodiment of the present invention. The structure of this embodiment is similar to that of the first embodiment, except that the hot air outlet 4b is open at an upper portion of the casing 4 and that the outdoor unit 14 of the heat exchanger 1 is placed on the top of the container 2. Because the condenser 9 must be placed above the evaporator 8, the outdoor unit 14 which includes the condenser 9 is placed on the top. In addition, in this particular example, the inside blower 6' is placed to face the evaporator 8 at the opposite side of the hot air outlet 4b. In this arrangement, the hot air blower 6' needs not be installed in the casing 4. The function of the heat exchanger 1 in the second embodiment is the same as that of the first embodiment. The outdoor unit 14 can be arbitrarily arranged within a space limitation of the base terminal. When the heat exchanger 1 is additionally installed to an existing cooling system having the air-conditioner 7, it is preferable to install the evaporator 8 and the condenser 9 first and then to connect both with the vapor and liquid pipes 11, 12. In this manner, the positions to install the evaporator 8 and the condenser 9 to the container 2 can be selected with a wider degree of freedom.

Figure 8:
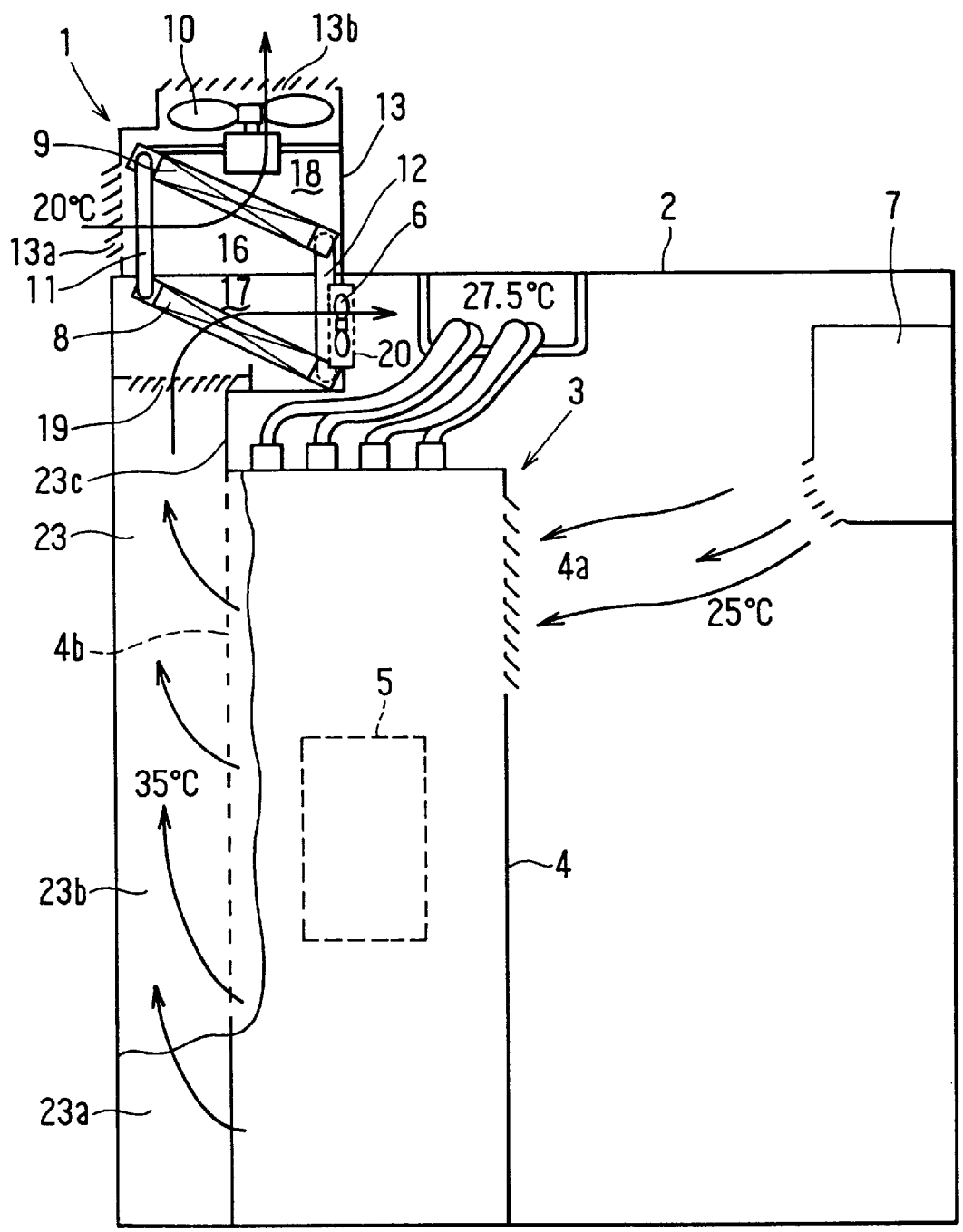
FIG. 8 is a cross-sectional view showing a cooling system as a third embodiment according to the present invention.

A third embodiment of the present invention will be described, referring to FIG. 8. A whole structure of this cooling system is similar to that of the first embodiment. Parts and components performing the same function as those in the first embodiment are numbered with the same reference numbers. A heat exchanger 1 of this embodiment is composed of a evaporator 8, a condenser 9, a vapor pipe 11, liquid pipe 12, an inside blower 6, an outside blower 10, and a case 13 containing those components therein. An inside space of the case 13 is divided into an outside space 18 and an inside space 17 by a separating wall 16. The heat exchanger 1 is installed on the ceiling wall of the container 2. The case 13 has an outside air inlet 13a from which outside air is introduced, an exhaust outlet 13b from which heat-exchanged air is blown out, and an inside air outlet 20 from which air cooled down through the evaporator 8 is blown toward the air-conditioner 7. An air duct 23 which leads the hot air blown out from the hot air outlet 4b to an air inlet 19 is formed facing the air outlet 4b. The duct 23 is defined by walls 23a, 23b and 23c in the container 2. Refrigerant such as HFC-134a ($CH_2FCF_3$), low-pressurized water or aqueous solution of ethylene-glycol is filled in the heat exchanger 1 before the heat exchanger 1 is installed on the container 2.

The cooling system described above functions as follows. Air in the casing 4 is heated by the hot object 5 and led from the hot air outlet 4b to the air duct 23 by operation of the inside blower 6. Then, the air is introduced into the inside space 17 of the heat exchanger 1 through the evaporator 8. The refrigerant in the evaporator 8 is vaporized by receiving heat from the air, while the air is cooled down and blown out from the inside air outlet 20 by operation of the inside blower 6. The vaporized refrigerant goes up to the condenser 9 through the vapor pipe 11 which connects an upper side of the evaporator 8 to an upper side of the condenser 9. The vaporized refrigerant is cooled down and condensed in the condenser 9 which in turn is cooled by outside air introduced into the heat exchanger 1 through the outside air inlet 13a by operation of the outside blower 10. The condensed refrigerant in the condenser 9 returns to the evaporator 8 through a liquid pipe 12 which connects a lower side of the condenser 9 to a lower side of the evaporator 8.

Assuming that air temperature blown out from the air-conditioner 7 is set at 25° C., the 25° C. air is taken into the casing 4 through the cool air inlet 4a. The air is heated up to 35° C. by the hot object 5 which generates 3 kw heat. The 35° C. air is introduced into the heat exchanger 1 through the duct 23 and cooled down to 27.5° C. through the evaporator 8 and then blown out from the inside air outlet 20. The air in the container 2 is circulated and cools down the hot object 5 in this manner. In other words, the air temperature rise of 10° C. caused by the hot object 5 is cooled down by the heat exchanger 1 by 7.5° C. and by the air-conditioner 7 by 2.5° C.

Figure 9:
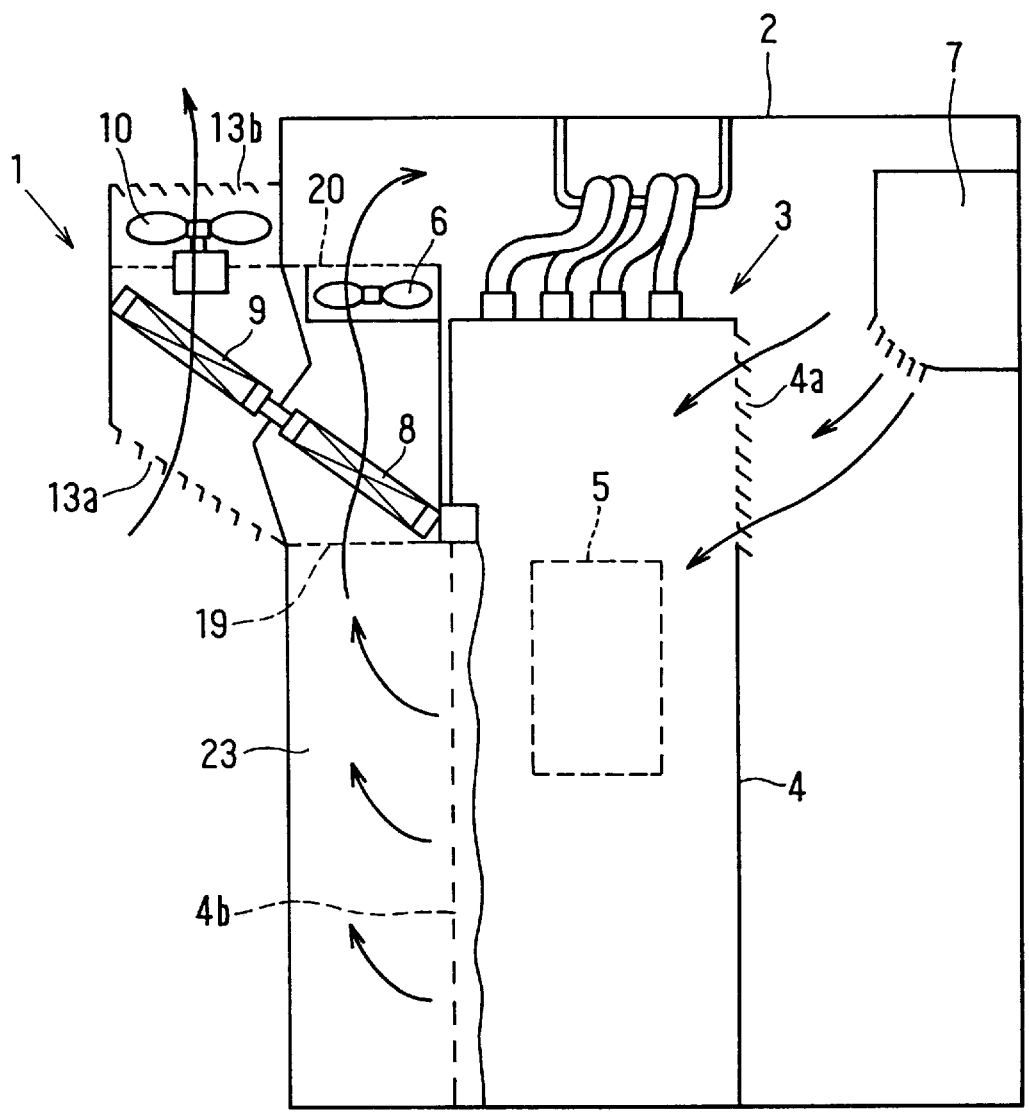
FIG. 9 is a cross-sectional view showing a cooling system as a fourth embodiment according to the present invention.

A fourth embodiment which is a modification of the third embodiment is shown in FIG. 9. The heat exchanger 1 having the evaporator 8, the condenser 9 and other components is installed on a side wall of the container 2, as opposed to the third embodiment in which the heat exchanger 1 is installed on the top wall of the container 2.

The evaporator 8 and the condenser 9 are connected in a longitudinal direction in this embodiment. The fourth embodiment functions in the same manner as the third embodiment does.

Figure 10:
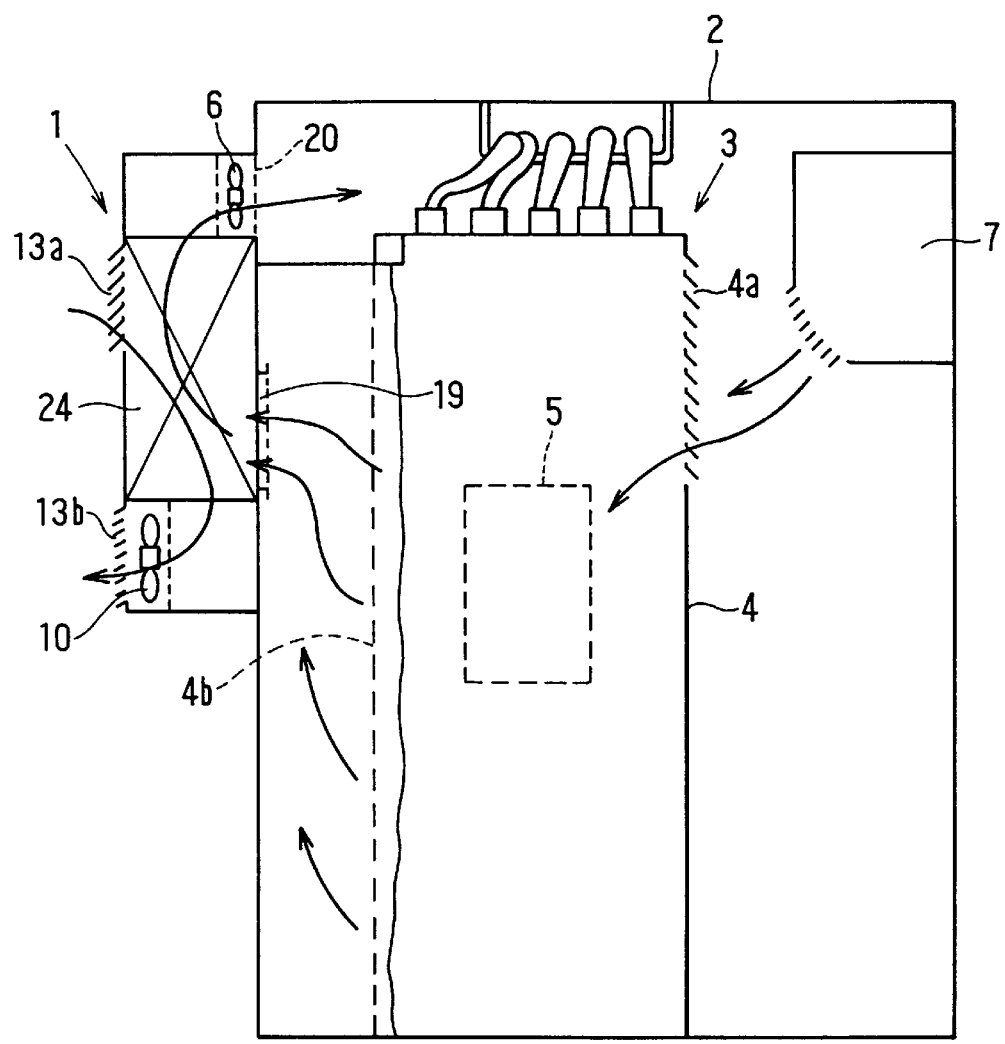
FIG. 10 is a cross-sectional view showing a cooling system as a fifth embodiment according to the present invention.
Figure 11:
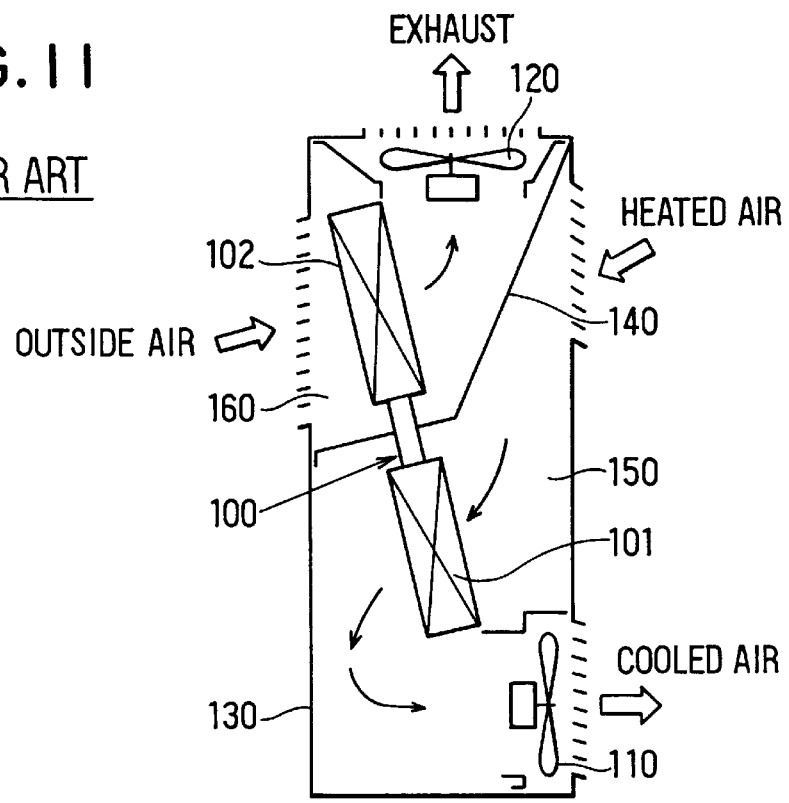
FIG. 11 is a schematic cross-sectional view showing a conventional heat exchanger.
Figure 12:
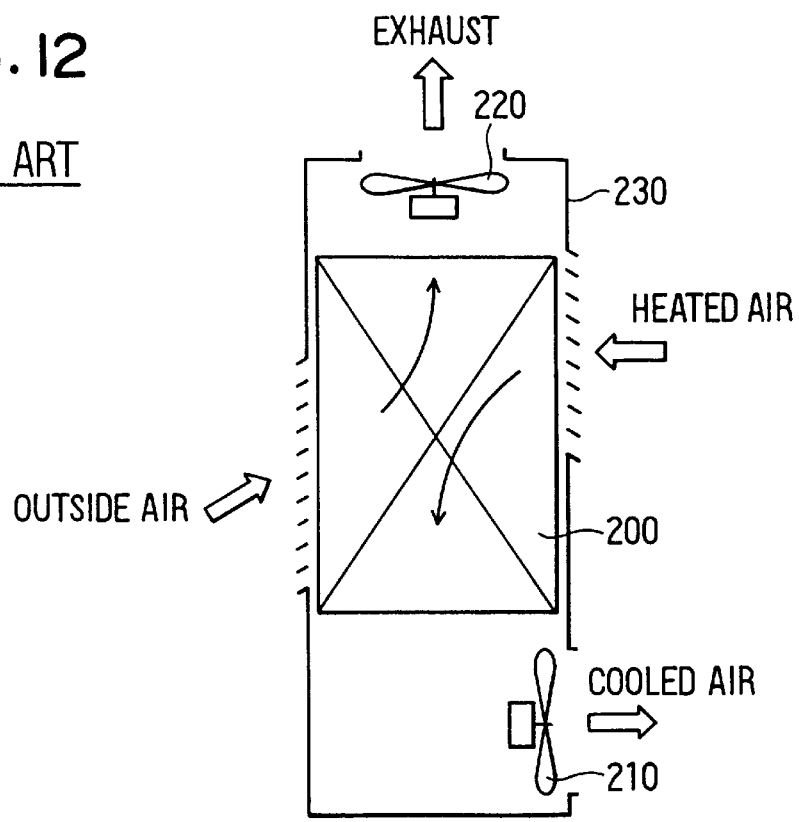
FIG. 12 is a schematic cross-sectional view showing another conventional heat exchanger.

A fifth embodiment of the present invention which is another modification of the third embodiment is shown in FIG. 10. A heat exchanger 24, which is an air-to-air heat exchanger as opposed to those used in the third and fourth embodiments, is installed on the side wall of the container 2. The heated air is introduced to one side of the heat exchanger 24 which faces the air inlet 19, and outside air is introduced to the other side of the heat exchanger 1 which faces the outside. The heated air and the outside air directly exchange heat in the heat exchanger 1. The function of this embodiment is the same as that of other embodiments described above.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A cooling system for cooling a hot object in a container, the cooling system comprising:
    an air-conditioner installed in the container for cooling air therein;
    a case provided in the container, having an interior space in which the hot object is to be contained, the interior space being partitioned from another space of the container in which the air-conditioner is installed, and the case having a cool air inlet from which air cooled by the air-conditioner is to be introduced and a hot air outlet from which air heated by the hot object is to be blown out; and
    a heat exchanger installed to the container for cooling the heated air blown out from the hot air outlet and for supplying air cooled by the heat exchanger to the hot object through the cool air inlet for the case, wherein:
    the heat exchanger includes:
        an evaporator arranged at the hot air outlet of the casing so that the air from the hot air outlet is blown to another space of the container through the evaporator, for receiving heat from the air blown from the hot air outlet; and
        a condenser arranged outside of the container, for radiating the heat to outside air.

2. The cooling system as in claim 1 wherein:
the heat exchanger further includes an outside blower for supplying outside air to the condenser.

3. The cooling system as in claim 1, wherein:
an inside blower for sending air from the hot air outlet to the evaporator is installed in the case.

4. The cooling system as in claim 1, wherein:
the heat exchanger further includes an inside blower for generating an air flow from the hot air outlet to the evaporator.

5. The cooling system as in claim 1, wherein:
the case includes a casing having the interior space in which the hot object is to be contained, and a conducting duct communicated with the casing and partitioned from another space of the container, for conducting the air blown from the hot air outlet to another space of the container; and
the evaporator is arranged in the conducting duct.

* * * * *